(12) United States Patent
Han (10) Patent No.: US 9,496,525 B2
(45) Date of Patent: Nov. 15, 2016

(54) ALIGNING METHOD OF MASK ASSEMBLY USING DEPOSITION APPARATUS

(71) Applicant: SAMSUNG DISPLAY CO., LTD., Yongin-si, Gyeonggi-do (KR)

(72) Inventor: Jeong Won Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 259 days.

(21) Appl. No.: 14/154,070

(22) Filed: Jan. 13, 2014

(65) Prior Publication Data

US 2015/0068023 A1  Mar. 12, 2015

(30) Foreign Application Priority Data

Sep. 11, 2013  (KR) .......................... 10-2013-0109367

(51) Int. Cl.
*H01L 51/56* (2006.01)
*C23C 14/04* (2006.01)
*H01L 51/00* (2006.01)

(52) U.S. Cl.
CPC ............. *H01L 51/56* (2013.01); *C23C 14/042* (2013.01); *H01L 51/0011* (2013.01); *Y10T 29/49* (2015.01)

(58) Field of Classification Search
CPC ............................. C23C 14/042; H01L 51/56
See application file for complete search history.

(56) References Cited

U.S. PATENT DOCUMENTS 5,534,969 A * 7/1996 Miyake .................. G03F 7/707
250/559.3
5,809,831 A * 9/1998 Nagai ..................... F16H 25/20
310/112

FOREIGN PATENT DOCUMENTS

| KR | 10-2003-0075221 A | 9/2003 |
| KR | 10-2007-0063307 A | 6/2007 |
| KR | 10-2009-0110979 A | 10/2009 |
| KR | 10-2013-0023313 A | 3/2013 |

\* cited by examiner

*Primary Examiner* — James M Mellott
(74) *Attorney, Agent, or Firm* — Lewis Roca Rothgerber Christie LLP (57) ABSTRACT

A method of aligning a mask assembly includes: providing a mask assembly including a mask and a mask frame; and adjusting the mask frame by independently moving at least a position of a lower portion of the mask frame and an upper portion of the mask frame.

8 Claims, 8 Drawing Sheets

ALIGNING METHOD OF MASK ASSEMBLY USING DEPOSITION APPARATUS

CROSS-REFERENCE TO RELATED APPLICATION

This application claims priority to and the benefit of Korean Patent Application No. 10-2013-0109367, filed on Sep. 11, 2013 in the Korean Intellectual Property Office, the entire content of which is incorporated herein by reference.

BACKGROUND

1. Field

Aspects of embodiments of the present invention relate to an aligning method of a mask assembly by using a deposition apparatus.

2. Description of the Related Art

As a flat panel display, a liquid crystal display (LCD) and an organic light emitting diode (OLED) display are known. The flat panel display includes a metal layer with a predetermined pattern, and an organic emission layer of the predetermined pattern is formed for every pixel in a case of the organic light emitting diode (OLED) display. A deposition method using a mask for forming the metal layer and the organic emission layer may be applied.

The mask causes non-uniformity of a pattern opening of the mask and a reduction of pixel position accuracy (PPA) as a size of the flat panel display is increased.

The above information disclosed in this Background section is only for enhancement of understanding of the background of the invention, and, therefore, it may contain information that does not form the prior art that is already known in this country to a person of ordinary skill in the art.

SUMMARY

According to aspects of embodiments of the present invention, a deposition apparatus controls a decrease and increase of a tensile force applied to a mask and prevents or substantially prevents a twist of a mask frame, and an aligning method of a mask assembly using the same is provided.

According to an aspect of embodiments of the present invention, an aligning method of a mask assembly by using a deposition apparatus including a thin film deposition mask assembly used in a deposition process of a thin film, such as an organic emission layer or a metal layer, is provided.

According to one or more exemplary embodiments of the present invention, a method of aligning a mask assembly using a deposition apparatus includes: providing a mask assembly including a mask and a mask frame; and adjusting the mask frame by independently moving at least a position of a lower portion of the mask frame and an upper portion of the mask frame.

In the adjusting of the mask frame, the upper portion and the lower portion of the mask frame may be equally moved by using a lower frame position controller and an upper frame position controller installed to a mask stage fixing the mask assembly to increase or decrease a tensile force applied to the mask.

In the adjusting of the mask frame, a position of the upper portion of the mask frame may be moved farther than a position of the lower portion of the mask frame by using a lower frame position controller and an upper frame position controller installed to a mask stage fixing the mask assembly to control a twist of the mask frame.

The lower frame position controller may be connected to a lower portion of the mask stage, and the upper frame position controller may be connected to an upper portion of the mask stage.

The lower frame position controller may include a lower supporter, a lower driver installed to the lower supporter and configured to generate a first driving force, and a lower driving force transmission unit connected to the lower driver to control the position of the lower portion of the mask frame by using the first driving force, and the upper frame position controller may include an upper supporter, an upper driver installed to the upper supporter and configured to generate a second driving force, and an upper driving force transmission unit connected to the upper driver to control the position of the upper portion of the mask frame by using the second driving force.

The lower driver and the upper driver may include motors, and the lower driving force transmission unit and the upper driving force transmission unit may include screw-thread portions. The method may further include installing a dust proofer to the lower frame position controller and the upper frame position controller.

At least one of the lower frame position controller or the upper frame position controller may be provided in plural in a number different from a number of the other of the lower frame position controller or the upper frame position controller.

According to an aspect of embodiments of the present invention, the deposition apparatus installs the lower frame position controller connected under the mask stage and the upper frame position controller connected on the mask stage such that the upper portion and the lower portion of the mask frame may be moved by using the lower frame position controller and the upper frame position controller, and thereby the position of the upper portion of the mask frame may be moved farther than the position of the lower portion of the mask frame. Accordingly, in the mask frame twisted by the tensile force, the twist may be eliminated or reduced. Accordingly, the increased interval between the mask and the substrate caused by the twist deformation of the mask frame may be compensated or reduced.

According to another aspect of embodiments of the present invention, the interval between the mask and the substrate may be reduced such that a defect in the deposition process due to an increase of the blocking region covered by the mask may be minimized or reduced.

| Description of Reference Numerals Indicating Some Elements in the Drawings | |
|---|---|
| 20: mask | 30: mask frame |
| 40: mask stage | 50: frame position controller |
| 51: lower frame position controller | 52: upper frame position controller |
| 60: dust proofer | |

DETAILED DESCRIPTION

The present invention is described more fully hereinafter with reference to the accompanying drawings, in which some exemplary embodiments of the present invention are shown. As those skilled in the art would realize, the described embodiments may be modified in various different ways, all without departing from the spirit or scope of the present invention. Accordingly, the drawings and description are to be regarded as illustrative in nature and not restrictive.

In the specification, unless explicitly described to the contrary, the word "comprise" and variations such as "comprises" or "comprising" are to be understood to imply the inclusion of stated elements but not the exclusion of any other elements. In addition, it is to be understood that when an element, such as a layer, film, region, or substrate, is referred to as being "on" another element, it may be directly on the other element or intervening elements may also be present. In contrast, when an element is referred to as being "directly on" another element, it is to be understood that there are no intervening elements present. Further, in the specification, it is to be understood that the word "on" means positioning on or below the object portion, and does not only mean positioning on the upper side of the object portion based on a gravity direction.

Figure 1:
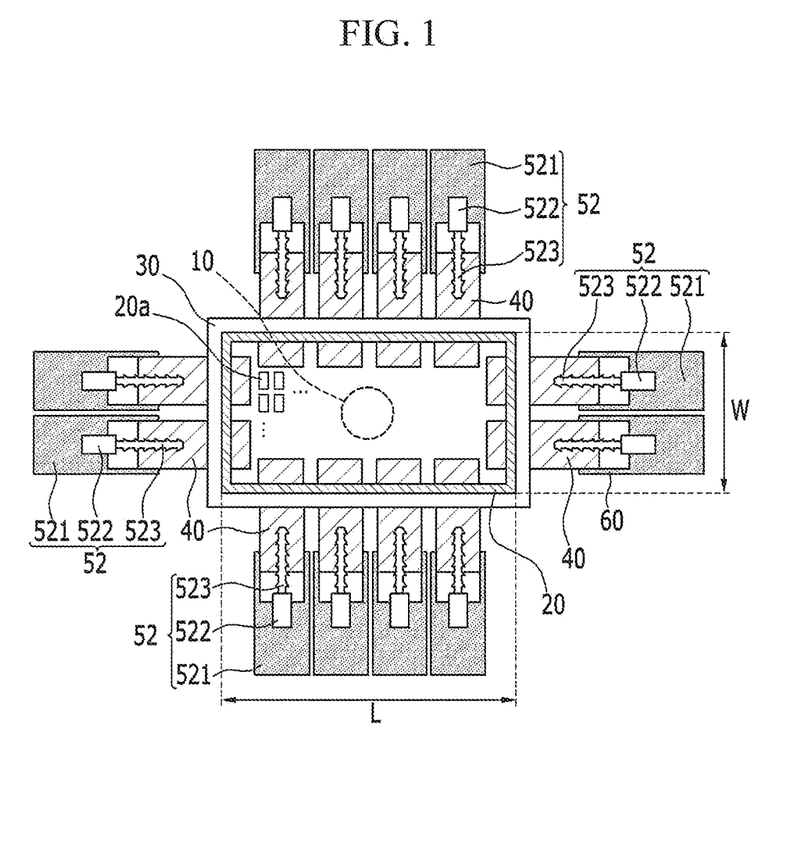
FIG. 1 is a top view of a deposition apparatus according to an exemplary embodiment of the present invention.
Figure 2:
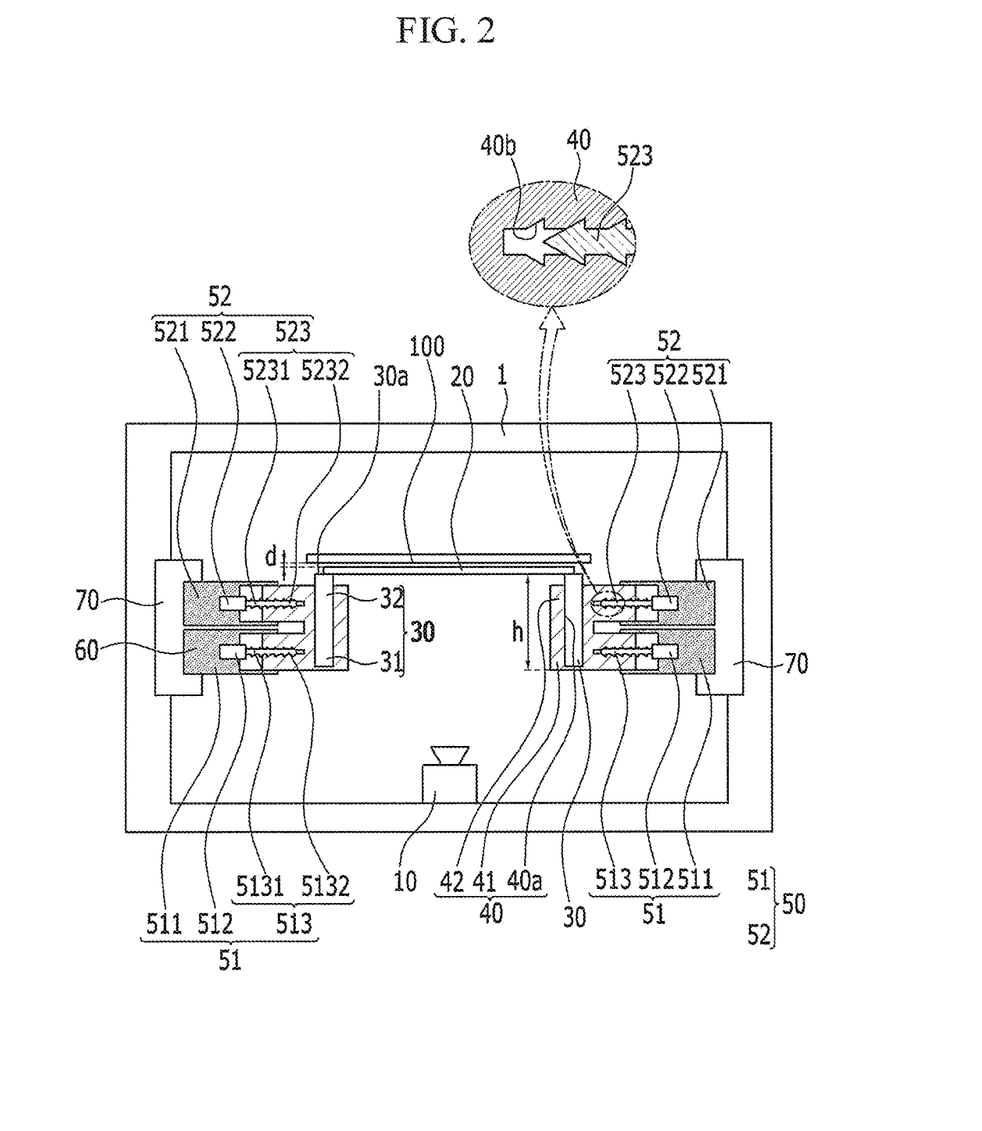
FIG. 2 is a side view of the deposition apparatus of FIG. 1.

FIG. 1 is a top view of a deposition apparatus according to an exemplary embodiment of the present invention; and FIG. 2 is a side view of the deposition apparatus of FIG. 1.

As shown in FIG. 1 and FIG. 2, a deposition apparatus according to an exemplary embodiment of the present invention includes a deposition chamber 1, a deposition source 10, a mask 20, a mask frame 30, at least one mask stage 40, at least one frame position controller 50, and a fixing member 70 fixing the frame position controller 50 to the deposition chamber 1.

The deposition chamber 1 maintains a vacuum while a deposition process is performed in the deposition chamber 1.

The deposition source 10 is installed inside the deposition chamber 1 and sprays a deposition material. The deposition source 10, in one embodiment, sprays the deposition material upward by heating a deposition container filled with the deposition material by using a heating member. The deposition source 10, in one embodiment, may be provided in plural in the deposition chamber 1.

The mask 20 is spaced from the deposition source 10 such that the deposition material is deposited with a predetermined pattern, The mask 20, in one embodiment, is a thin metal quadrangular plate having a length (L) and a width (W), and a plurality of pattern openings 20a. The pattern openings 20a are formed having a same shape as a thin film to be deposited. Accordingly, in the deposition process, the deposition material passes through the pattern openings 20a and is deposited on the substrate 100, thereby forming a thin film (e.g., a metal layer, an organic emission layer, etc.) of a desired shape and pattern.

The mask 20 is positioned over the deposition source 10, and the substrate 100, in one embodiment, is positioned above and spaced apart from the mask 20 by a distance (e.g., a predetermined distance) (d).

The mask frame 30 supports the mask 20 and has a shape (e.g., a square shape) that is larger than a size of the mask 20, and the mask 20 is fixed to the mask frame 30, such as by welding.

The mask frame 30, in one embodiment, has four edges forming a square frame shape, and the four edges respectively include a frame upper surface 30a contacting the mask 20. The mask frame 30 extends in a downward direction from the frame upper surface 30a and has a predetermined height (h), such that an end closer to the frame upper surface 30a is an upper portion 32 of the mask frame 30, and an end farther from the frame upper surface 30a is a lower portion 31 of the mask frame 30.

In one embodiment, in a state of extending the mask 20, a mask assembly is completed by welding the mask 20 onto the mask frame 30. In the deposition apparatus, the mask frame 30 may be manufactured of one fixed body while having high processing accuracy. Accordingly, in one embodiment, after the mask 20 is extended and welded, the tensile force applied to the mask 20 may not be increased or decreased. As described above, since the increasing or decreasing of a tensile force to the mask 20 may not be made, much time and effort are required in the tensile process of the mask 20 and the welding process on the mask frame 30, and if the tensile process and the welding process of the mask 20 are abnormally performed, the used mask 20 must be discarded. Further, when the mask and the mask frame are used for performing the deposition process, non-uniformity of a size of opening in the mask and a reduction of a pixel position precision may be generated, and, in this instance, the mask that is extended and welded on the mask frame 30 may be separated from the mask frame to be discarded. According to an embodiment of the present invention, to avoid discarding of the mask 20, the mask frame 30 is capable of increasing or decreasing a tensile force applied to the mask 20. However, in a method of increasing or decreasing the tensile force with a same moving amount for one entire edge of the mask frame, when requiring a partial change of the mask, the method does not correspond to this case, and while the increasing or decreasing of the tensile force is possible, a twist of the mask frame 30 may not be avoided.

That is, a center portion of the mask may sag downward by the weight of the mask 20, and, accordingly, to prevent or substantially prevent the pattern opening 20a of the mask 20 from being changed, the mask 20 is attached to the mask frame 30 by welding in a state of extending both sides of the mask 20 in opposite directions such that a torsion with which the mask frame 30 is twisted is generated in the mask frame 30 when viewing a cross-section of the mask frame 30. Accordingly, the mask frame 30 is inclined and the upper portions 32 of four edges of the mask frame 30 are closer than the lower portion 31 such that the mask frame 30 is twisted.

Accordingly, in a case of using the mask assembly in the deposition apparatus, the mask 20 is positioned at a lower position than the predetermined position by the tension of the mask frame 30 such that an interval between the substrate to be deposited by the deposition material and the mask 20 is increased compared with a predetermined value.

As described above, when the interval between the substrate and the mask 20 is increased, a blocking region covered by the mask 20 is increased such that the deposition material is deposited with a wider position than the deposition region, thereby generating a defect in the deposition process. The mask stage 40 includes a stage groove 40a to which the mask frame 30 is fixed to fix four edges of the mask frame 30. The mask frame 30 is inserted into the stage groove 40a to be fixed to the mask stage 40. One or more mask stages 40 may be installed to one edge of the mask frame 30.

At least one frame position controller 50 controls the position of the mask frame 30. The frame position controller 50 includes a lower frame position controller 51 connected to a lower portion 41 of the mask stage 40, and an upper frame position controller 52 connected to an upper portion 42 of the mask stage 40.

The lower frame position controller 51, in one embodiment, includes a lower supporter 511, a lower driver 512 installed to the lower supporter 511 and generating a driving force, and a lower driving force transmission unit 513 connected to the lower driver 512 and controlling the position of the mask frame 30 by using the driving force.

The lower supporter 511, in one embodiment, may be a frame having a hexahedral shape, and the lower driver 512 is installed and fixed in the lower supporter 511. One end 5131 of the lower driving force transmission unit 513 is connected to the lower driver 512, and the other end 5132 of the lower driving force transmission unit 513 is coupled to a threaded groove 40b formed in the lower portion 41 of the mask stage 40.

The upper frame position controller 52, in one embodiment, includes an upper supporter 521, an upper driver 522 installed to the upper supporter 521 and generating a driving force, and an upper driving force transmission unit 523 connected to the upper driver 522 and controlling the position of the mask frame 30 by using the driving force.

The upper supporter 521, in one embodiment, may be a frame having a hexahedral shape, and the upper driver 522 is installed and fixed in the upper supporter 521. One end 5231 of the upper driving force transmission unit 523 is connected to the upper driver 522, and the other end 5232 of the upper driving force transmission unit 523 is coupled to the threaded groove 40b formed in the upper portion 42 of the mask stage 40.

The lower driver 512 and the upper driver 522 may be motors, and the lower driving force transmission unit 513 and the upper driving force transmission unit 523 may be screw-thread portions.

By rotating the screw-thread portion of the upper driving force transmission unit 523 by using the upper driver 522, the upper portion 42 of the mask stage 40 attached to the upper driving force transmission unit 523 may be moved toward the side of the deposition chamber 1, and by rotating the screw-thread portion of the lower driving force transmission unit 513 by using the lower driver 512, the lower portion 41 of the mask stage 40 attached to the lower driving force transmission unit 513 may be moved toward the center of the mask 20.

As described above, by independently moving the positions of the upper portion 32 and the lower portion 31 of the mask frame 30 by using the lower frame position controller 51 and the upper frame position controller 52, the position of the upper portion 32 of the mask frame 30 may be controlled to be different from the lower portion 31 of the mask frame 30. Accordingly, the tensile force of the mask frame 30 twisted by an imbalance of the tensile force applied to the upper portion 32 and the lower portion 31 of the mask frame 30 may be controlled to be uniform or substantially uniform.

Accordingly, the interval or distance (d) between the mask 20 and the substrate 100 that is increased by the tension deformation of the mask frame 30 may be compensated.

Also, the positions of the upper portion 32 and the lower portion 31 of the mask frame 30 may be equally moved by using the lower frame position controller 51 and the upper frame position controller 52.

By rotating the upper driving force transmission unit 523 by using the upper driver 522, the upper portion 42 of the mask stage 40 attached to the upper driving force transmission unit 523 may be moved toward the side of the deposition chamber 1, and by rotating the lower driving force transmission unit 513 by using the lower driver 512, the lower portion 41 of the mask stage 40 attached to the lower driving force transmission unit 513 may be moved toward the side of the deposition chamber 1 like the upper portion 42. Also, by rotating the upper driving force transmission unit 523 by using the upper driver 522, the upper portion 42 of the mask stage 40 attached to the upper driving force transmission unit 523 may be moved toward the center of the mask 20, and by rotating the lower driving force transmission unit 513 by using the lower driver 512, the lower portion 41 of the mask stage 40 attached to the lower driving force transmission unit 513 may be moved toward the center of the mask 20 like the upper portion 42.

In this case, a horizontal direction force may be applied to the mask frame 30 such that the tensile force applied to the mask 20 extended and welded to the mask frame 30 may be controlled, thereby controlling the position of the pattern openings 20a of the mask 20.

As described above, the tensile force may be additionally increased or decreased to the mask 20 by using the lower frame position controller 51 and the upper frame position controller 52, such that time and effort required for the initial tensile and welding process between the mask 20 and the mask frame 30 may be reduced.

Further, if the initial tensile and welding processes between the mask 20 and the mask frame 30 are not performed with desired accuracy, instead of the mask 20 being separated from the mask frame 30 to be discarded, the tensile force applied to the mask 20 may be increased or decreased by using the lower frame position controller 51 and the upper frame position controller 52, the accuracy of the mask 20 may be adjusted to the desired value, and the size and the uniformity of the pattern opening of the mask 20 and the pixel position accuracy (PPA) may be controlled, thereby minimizing or reducing a number of discarded masks, and a time for the mask replacement is reduced such that continuous processing time of the deposition apparatus is increased, thereby improving productivity.

In one embodiment, the lower frame position controller 51 and the upper frame position controller 52 are installed with dust proofers 60 respectively extended from the lower supporter 511 and the upper supporter 521 and covering the lower driver 512 and the lower driving force transmission unit 513, and the upper driver 522 and the upper driving force transmission unit 523. The dust proofer 60 prevents or substantially prevents particles such as dust generated in the lower driver 512, the upper driver 522, the lower driving force transmission unit 513, and the upper driving force transmission unit 523 from being deposited on the substrate 100. In one embodiment, the dust proofer 60 as a structure for shielding the lower driver 512, the upper driver 522, the lower driving force transmission unit 513, and the upper driving force transmission unit 523 from the outside may include an O-ring or a bellow valve.

An aligning method of a mask assembly using a deposition apparatus, according to an exemplary embodiment of the present invention, is described below with reference to FIG. 3 to FIG. 6.

Figure 3:
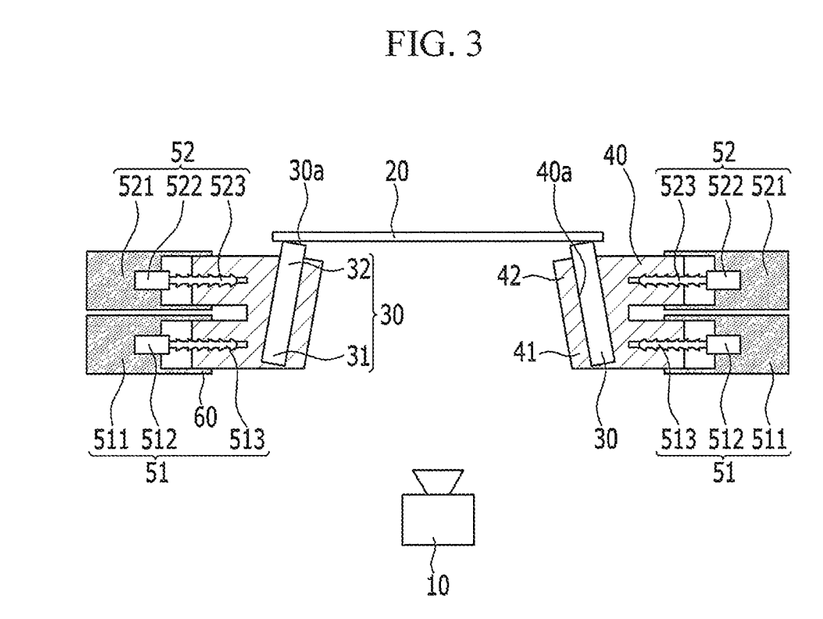
FIG. 3 and FIG. 4 are views sequentially showing an aligning method of a mask assembly using a deposition apparatus, according to an exemplary embodiment of the present invention, as a method of aligning the mask assembly by removing a twist of a mask frame.
Figure 4:
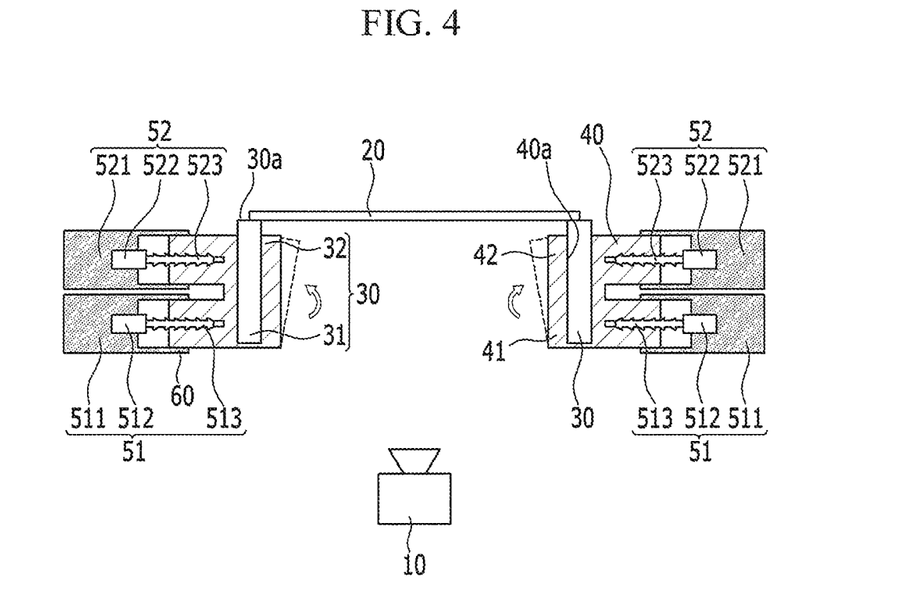
Figure 5:
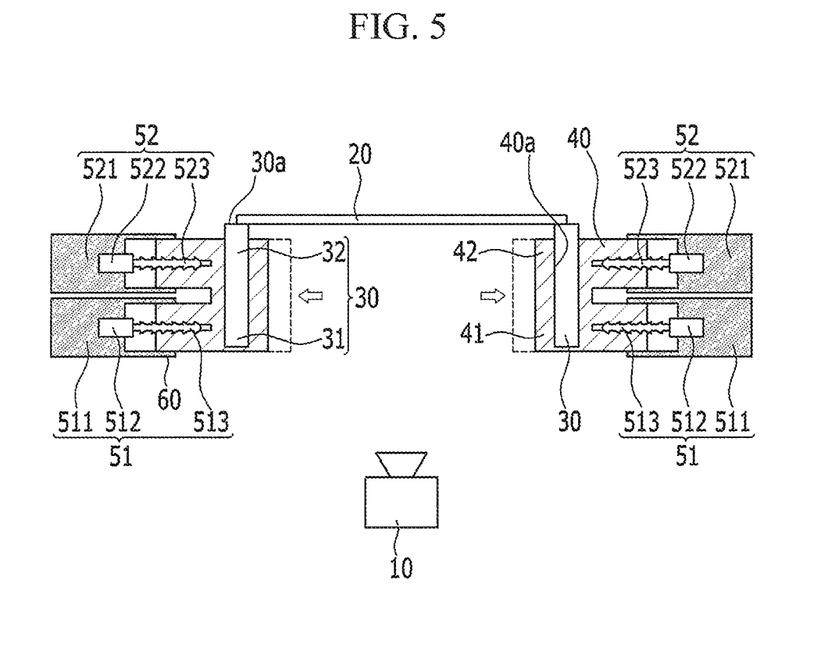
FIG. 5 and FIG. 6 are views sequentially showing an aligning method of a mask assembly using a deposition apparatus, according to an exemplary embodiment of the present invention, as a method of aligning the mask assembly through a horizontal direction movement of a mask frame.
Figure 6:
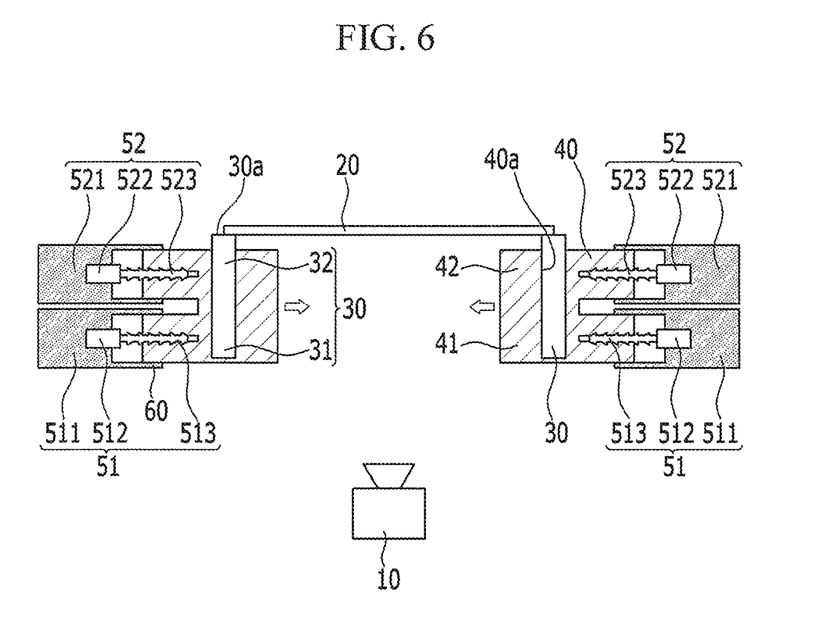

FIG. 3 and FIG. 4 are views sequentially showing an aligning method of a mask assembly using a deposition apparatus, according to an exemplary embodiment of the present invention, as a method of aligning the mask assembly by removing a twist of a mask frame; and FIG. 5 and FIG. 6 are views sequentially showing an aligning method of a mask assembly using a deposition apparatus, according to an exemplary embodiment of the present invention, as a method of aligning the mask assembly through a horizontal direction movement of a mask frame.

As shown in FIG. 3, in the state that the mask frame 30 is twisted by the tensile force applied to the mask 20, as shown in FIG. 4, by using the lower frame position controller 51 and the upper frame position controller 52, the upper portion 32 of the mask frame 30 is moved farther than the lower portion 31, thereby removing the tension of the mask frame 30.

Also, as shown in FIG. 5, by using the lower frame position controller 51 and the upper frame position controller 52, the positions of the lower portion 31 and the upper portion 32 of the mask frame 30 are equally moved to increase the tensile force applied to the mask 20, or as shown in FIG. 6, to decrease the tensile force applied to the mask 20.

In one exemplary embodiment, the lower frame position controller and the upper frame position controller are installed in plural to one edge of the mask frame 30. However, in another exemplary embodiment, one lower frame position controller and one upper frame position controller may be installed to one edge of the mask frame 30.

Figure 7:
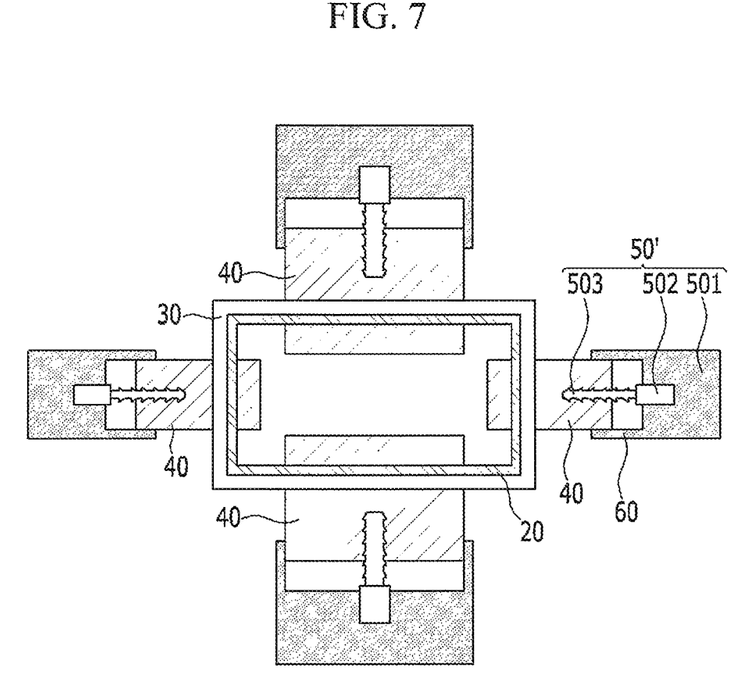
FIG. 7 is a top view of a deposition apparatus according to another exemplary embodiment of the present invention.

FIG. 7 is a top view of a deposition apparatus according to another exemplary embodiment of the present invention.

The exemplary embodiment shown in FIG. 7 is substantially the same as an exemplary embodiment shown in FIG. 1 and FIG. 2, except for the number of the lower frame position controllers and the upper frame position controllers, and repeated description of same components is therefore omitted.

As shown in FIG. 7, the mask stage 40 fixing the mask frame 30 of the deposition apparatus according to another exemplary embodiment of the present invention is installed one by one to each edge of the mask frame 30. Also, one frame position controller 50' is connected to the mask stage 40 installed to each edge. The frame position controller 50' includes a supporter 501, a driver 502 installed to the supporter 501 and generating a driving force, and a driving force transmission unit 503 connected to the driver 502 and controlling the position of the mask frame 30 by using the driving force.

As described above, by installing the frame position controller 50' to the mask stage 40 one by one to each edge of the mask frame 30, the tensile force that is increased or decreased to the mask 20 may be easily controlled.

Although not shown, in the exemplary embodiment shown in FIG. 7, the number of lower frame position controllers and upper frame position controllers may be the same. That is, in FIG. 7, the frame position controllers 50' shown are upper frame position controllers, and lower frame position controllers are also included to correspond to the upper frame position controllers. However, in another embodiment, the number of the lower frame position controllers and a number of the upper frame position controllers may be different, as described below.

Figure 8:
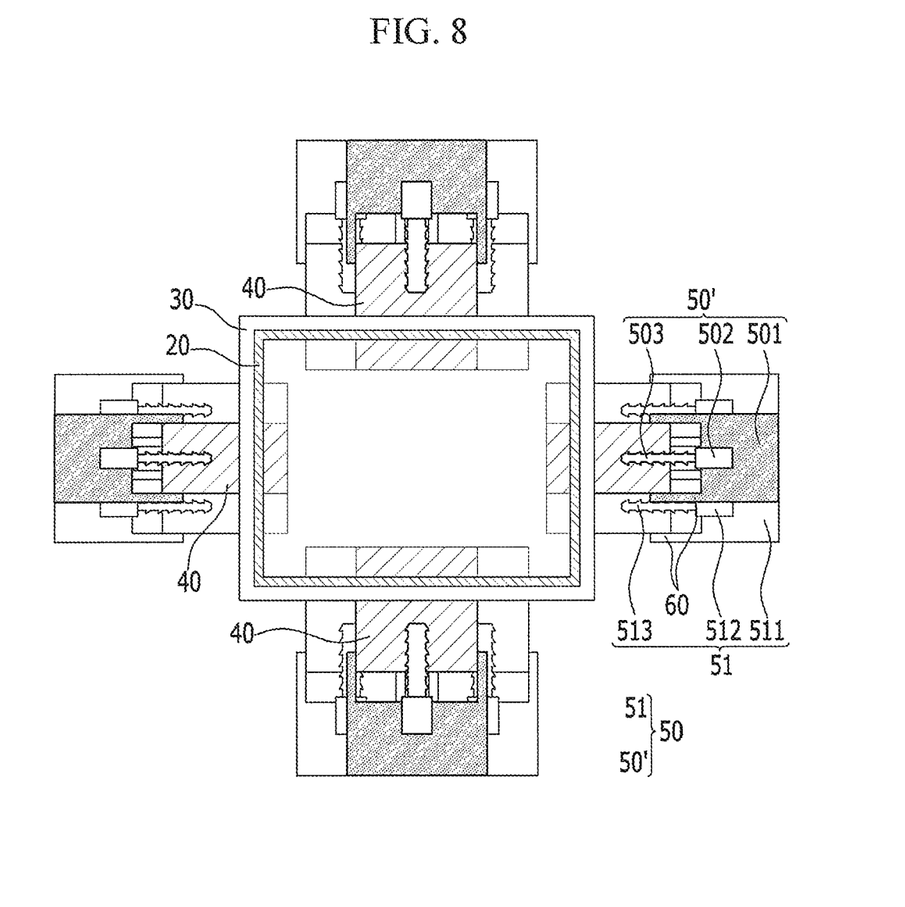
FIG. 8 is a top view of a deposition apparatus according to another exemplary embodiment of the present invention.

FIG. 8 is a top view of a deposition apparatus according to another exemplary embodiment of the present invention.

The exemplary embodiment shown in FIG. 8 is substantially the same as the exemplary embodiment shown in FIG. 1 and FIG. 2, except for the lower frame position controller and the upper frame position controller having a different number, and repeated description of same components is therefore omitted.

As shown in FIG. 8, a frame position controller 50" of a deposition apparatus according to another exemplary embodiment of the present invention includes the lower frame position controller 51 connected to a lower portion of the mask stage 40 and the upper frame position controller 50' connected to an upper portion of the mask stage 40.

The number of lower frame position controllers 51 and the number of upper frame position controllers 50' may be different. In FIG. 8, the number of lower frame position controllers 51 is two, and the number of upper frame position controllers 50' is one.

As described above, by differentiating the numbers of the lower frame position controller 51 and the upper frame position controller 50', the twist of the mask frame 30 may be further easily controlled.

While this invention has been described in connection with what are presently considered to be some practical exemplary embodiments, it is to be understood that, the invention is not limited to the disclosed embodiments, but, on the contrary, is intended to cover various modifications and equivalent arrangements included within the spirit and scope of the appended claims and equivalents thereof.

What is claimed is:

1. A method of aligning a mask assembly, the method comprising:
   providing a mask assembly including a mask and a mask frame; and
   adjusting the mask frame by independently moving a position of a lower portion of the mask frame and a position of an upper portion of the mask frame, the position of the lower portion of the mask frame and the position of the upper portion of the mask frame being a same location about a perimeter of the mask frame.

2. The method of claim 1, wherein, in the adjusting of the mask frame, the upper portion and the lower portion of the mask frame are equally moved by using a lower frame position controller and an upper frame position controller installed to a mask stage fixing the mask assembly to increase or decrease a tensile force applied to the mask.

3. The method of claim 1, wherein, in the adjusting of the mask frame, the position of the upper portion of the mask frame is moved farther than the position of the lower portion of the mask frame by using a lower frame position controller and an upper frame position controller installed to a mask stage fixing the mask assembly to control a twist of the mask frame.

4. The method of claim 3, wherein the lower frame position controller is connected to a lower portion of the mask stage, and the upper frame position controller is connected to an upper portion of the mask stage.

5. The method of claim 4,
   wherein the lower frame position controller comprises:
   a lower supporter;
   a lower driver installed to the lower supporter and configured to generate a first driving force; and a lower driving force transmission unit connected to the lower driver to control the position of the lower portion of the mask frame by using the first driving force, and wherein the upper frame position controller comprises:
an upper supporter;
an upper driver installed to the upper supporter and configured to generate a second driving force; and
an upper driving force transmission unit connected to the upper driver to control the position of the upper portion of the mask frame by using the second driving force.

6. The method of claim 5, wherein the lower driver and the upper driver comprise motors, and the lower driving force transmission unit and the upper driving force transmission unit comprise screw-thread portions.

7. The method of claim 4, further comprising installing a dust proofer to the lower frame position controller and the upper frame position controller.

8. The method of claim 4, wherein at least one of the lower frame position controller or the upper frame position controller is provided in plural in a number different from a number of the other of the lower frame position controller or the upper frame position controller.

* * * * *